United States Patent
Kitabata et al.

(10) Patent No.: US 9,427,913 B2
(45) Date of Patent: Aug. 30, 2016

(54) HEAT TRANSFER SHEET ADHERING APPARATUS AND METHOD

(71) Applicant: TOKYO ELECTRON LIMITED, Tokyo (JP)

(72) Inventors: Toshinori Kitabata, Miyagi (JP); Kazuya Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 563 days.

(21) Appl. No.: 13/937,254

(22) Filed: Jul. 9, 2013

(65) Prior Publication Data

US 2014/0008010 A1 Jan. 9, 2014

Related U.S. Application Data

(60) Provisional application No. 61/671,842, filed on Jul. 16, 2012.

(30) Foreign Application Priority Data

Jul. 9, 2012 (JP) ................... 2012-153905

(51) Int. Cl.
- *B32B 37/00* (2006.01)
- *B29C 65/00* (2006.01)
- *H01L 21/67* (2006.01)
- *B29C 65/78* (2006.01)

(52) U.S. Cl.
CPC ....... *B29C 66/472* (2013.01); *H01L 21/67092* (2013.01); *H01L 21/67132* (2013.01); *B29C 65/7841* (2013.01); *B29C 66/24221* (2013.01); *B29C 66/342* (2013.01); *B29C 66/345* (2013.01); *B29C 66/4722* (2013.01); *B29C 66/71* (2013.01); *B29C 66/742* (2013.01);

(Continued)

(58) Field of Classification Search
CPC ................ B29C 66/472; B29C 66/81; H01L 21/67092; H01L 21/67132
USPC .............................. 156/228, 580, 581, 583.1
See application file for complete search history.

(56) References Cited

U.S. PATENT DOCUMENTS 4,944,860 A * 7/1990 Bramhall, Jr. .......... C23C 14/50
  118/500
2004/0261946 A1* 12/2004 Endoh ............... H01J 37/32082
  156/345.15

(Continued)

FOREIGN PATENT DOCUMENTS

JP 10-233431 A 9/1998
JP 2002-25111 A 1/2002

(Continued)

*Primary Examiner* — James Sells
(74) *Attorney, Agent, or Firm* — Rothwell, Figg, Ernst & Manbeck, P.C.

(57) ABSTRACT

A heat transfer sheet adhering apparatus, for adhering a heat transfer sheet to a ring-shaped member adapted to be used in a substrate processing apparatus, includes a heat transfer sheet mounting part configured to mount the heat transfer sheet thereon; a ring-shaped member supporting part configured to support the ring-shaped member; and a vertically movable pressing part configured to press the ring-shaped member supported by the ring-shaped member supporting part against the heat transfer sheet mounted on the heat transfer sheet mounting part. The pressing part is configured to press the ring-shaped member gradually from an inner peripheral side to an outer peripheral side of the ring-shaped member or from the outer peripheral side to the inner peripheral side of the ring-shaped member.

12 Claims, 15 Drawing Sheets

(52) U.S. Cl.
  CPC ...... *B29C 66/7422* (2013.01); *B29C 66/8161* (2013.01); *B29C 66/81417* (2013.01); *B29C 66/81427* (2013.01); *B29C 66/81463* (2013.01); *B29C 66/8223* (2013.01); *B29C 66/8322* (2013.01)

(56) References Cited

U.S. PATENT DOCUMENTS

| | | | |
|---|---|---|---|
| 2008/0166894 | A1 | 7/2008 | Miyagawa et al. |
| 2011/0240221 | A1* | 10/2011 | Yamamoto ........ H01J 37/32091 156/345.28 |
| 2011/0247759 | A1* | 10/2011 | Kitajima ........... H01J 37/32091 156/583.1 |
| 2012/0247954 | A1* | 10/2012 | Yamawaku ....... H01J 37/32091 204/298.31 |

FOREIGN PATENT DOCUMENTS

| | | |
|---|---|---|
| JP | 2008-171899 A | 7/2008 |
| JP | 2011-124377 A | 6/2011 |
| JP | 2011-151280 A | 8/2011 |
| JP | 2012-30922 A | 2/2012 |

* cited by examiner

HEAT TRANSFER SHEET ADHERING APPARATUS AND METHOD

CROSS-REFERENCE TO RELATED APPLICATION

This application claims priority to Japanese Patent Application No. 2012-153905 filed on Jul. 9, 2012 and U.S. Provisional Application No. 61/671,842 filed on Jul. 16, 2012, the entire contents of which are incorporated herein by reference.

FIELD OF THE INVENTION

The present invention relates to a heat transfer sheet adhering apparatus and a heat transfer sheet adhering method, which are capable of adhering a heat transfer sheet to a ring-shaped member, such as a focus ring or the like, which is disposed on a mounting table for a substrate to be processed through the heat transfer sheet.

BACKGROUND OF THE INVENTION

In general, a substrate processing apparatus for performing plasma process, such as etching, film-forming or the like, on a substrate, e.g., a semiconductor wafer (hereinafter referred to as "wafer") has a mounting table for mounting the wafer thereon in a processing chamber. A plurality of ring-shaped members is disposed on the mounting table. One example of the ring-shaped members is a focus ring disposed to surround the wafer on the mounting table. The focus ring serves to expand the distribution area of plasma generated above the wafer to above the focus ring as well as the wafer so that, e.g., the uniformity of etching performed over the entire surface of the wafer can be secured.

Since the focus ring as well as the wafer is directly exposed to the plasma, its temperature increases due to heat generated by the plasma. Accordingly, a temperature of the mounting table is controlled to adjust a temperature of the focus ring as well as a temperature of the wafer.

However, when heat transfer efficiency between the mounting table and the focus ring is poor, it is difficult to control the temperature of the focus ring. Therefore, a heat transfer sheet has been recently disposed between the mounting table and the focus ring to enhance adhesion therebetween, thereby increasing the heat transfer efficiency (see, e.g., Japanese Patent Application Publication No. 2008-171899 (JP2008-171899A)).

However, since the heat transfer sheet is made of, for example, silicone rubber and the like, when it is adhered to the focus ring made of a metal material such as aluminum or the like, air bubbles are easily generated between the heat transfer sheet and the focus ring. If air bubbles are generated, the air bubbles serve as an insulating layer. Thus, the heat transfer efficiency of the mounting table (susceptor) is reduced, which deteriorates the temperature control efficiency of the mounting table. Accordingly, the temperature of the focus ring becomes partially high due to the heat of plasma and the like, which decreases the in-plane uniformity of a plasma process characteristic such as an etching characteristic.

In this regard, for example, as disclosed in JP2008-171899A, there has been proposed a technology in which while the heat transfer sheet is interposed between the focus ring and the mounting table, fine air bubbles dispersedly existing in the heat transfer sheet inflate to become concentrated under a vacuum pressure state, and then the concentrated air bubbles are removed by bringing the vacuum pressure state back to an atmospheric pressure state from (see, e.g., JP2008-171899A).

However, the amount of the air bubbles and locations where the air bubbles are generated depend on an installation state of the heat transfer sheet. Thus, the air bubbles cannot be completely removed by the pressure control as in JP2008-171899A because conditions of the air bubbles are changed depending on the initial installation state of the heat transfer sheet.

SUMMARY OF THE INVENTION

In view of the above, the present invention provides a heat transfer sheet adhering apparatus and method, which can always reliably remove air bubbles generated between a heat transfer sheet and a focus ring when the heat transfer sheet is adhered to the focus ring.

In accordance with an aspect of the present invention, there is provided a heat transfer sheet adhering apparatus for adhering a heat transfer sheet to a ring-shaped member adapted to be used in a substrate processing apparatus, the heat transfer sheet adhering apparatus including: a heat transfer sheet mounting part configured to mount the heat transfer sheet thereon; a ring-shaped member supporting part configured to support the ring-shaped member; and a vertically movable pressing part configured to press the ring-shaped member supported by the ring-shaped member supporting part against the heat transfer sheet mounted on the heat transfer sheet mounting part; wherein the pressing part is configured to press the ring-shaped member gradually from an inner peripheral side to an outer peripheral side of the ring-shaped member or from the outer peripheral side to the inner peripheral side of the ring-shaped member.

In accordance with another aspect of the present invention, there is provided a heat transfer sheet adhering method for adhering a heat transfer sheet to a ring-shaped member adapted to be used in a substrate processing apparatus, the method including: pressing the ring-shaped member against the heat transfer sheet mounted on a heat transfer sheet mounting part with a pressing part to adhere the heat transfer sheet to the ring-shaped member, wherein the pressing part gradually presses the ring-shaped member from an inner peripheral side to an outer peripheral side of the ring-shaped member or from the inner peripheral side to the outer peripheral side of the ring-shaped member.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
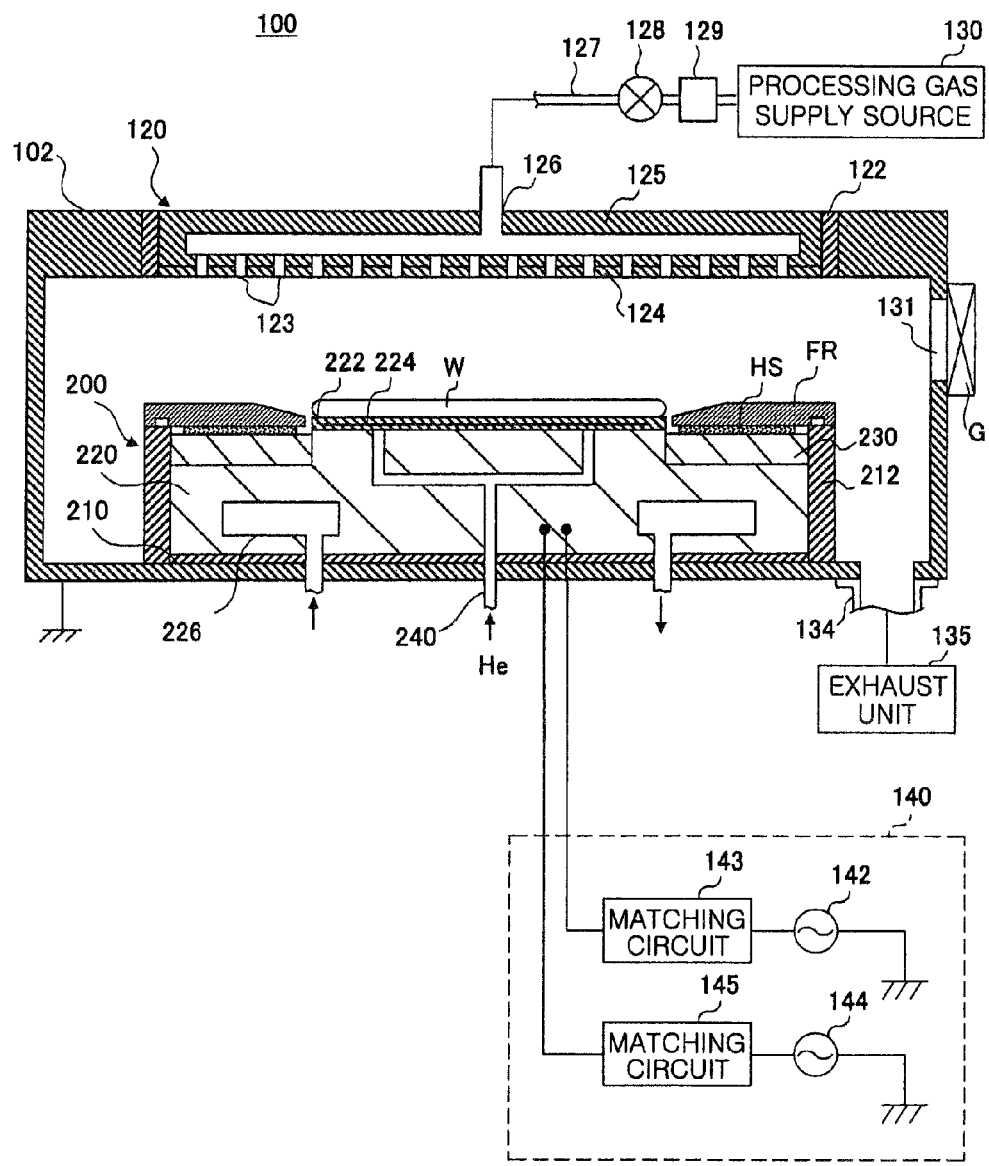
FIG. 1 is a cross-sectional view showing an example of the configuration of a plasma processing apparatus to which a heat transfer sheet according to an embodiment of the present invention can be applied.

Embodiments of the present invention will now be described in detail with reference to the accompanying drawings which form a part hereof.

Throughout the specification and the drawings, the elements having substantially the same functions and configurations are denoted by the same reference numerals, and redundant description thereof will be omitted.

(Substrate Processing Apparatus to which a Heat Transfer Sheet can be Applied)

First, a heat transfer sheet adhered to a ring-shaped member used in the substrate processing apparatus will be explained with reference to the drawings. Here, a plasma processing apparatus for performing a plasma processing, such as etching, film-forming or the like, on a substrate such as a wafer or the like is used as an example of the substrate processing apparatus, and a focus ring is used as an example of the ring-shaped member disposed on a mounting table. The following description will be given to a case in which the heat transfer sheet is adhered to the focus ring. FIG. 1 is a view showing an example of a configuration of the plasma processing apparatus to which the heat transfer sheet according to the present embodiment can be applied.

A plasma processing apparatus 100 includes a cylindrical processing chamber 102 made of, e.g., anodized (alumite-treated) aluminum. The processing chamber 102 is grounded. A cylindrical mounting table 200 for mounting a wafer W thereon is provided on a bottom portion in the processing chamber 102. The mounting table 200 has an insulating plate 210 formed of a ceramic or the like, and a susceptor 220 provided on the insulating plate 210, the susceptor 22 serving as a lower electrode. An outer periphery of the susceptor 220 is covered by an insulating wall 212.

A temperature control medium channel 226 is formed in the susceptor 220. As illustrated in FIG. 1, the temperature control medium channel 226 is configured such that a temperature control medium is introduced through an inlet pipe and circulated to be discharged through an outlet pipe. A temperature of the wafer W can be controlled by controlling a temperature of the susceptor 220 through the circulation of the temperature control medium.

The susceptor 220 has a protruding substrate mounting portion at an upper central portion thereof. An electrostatic chuck 222 is disposed on the substrate mounting portion. The electrostatic chuck 222 is configured such that an electrode 224 is interposed between insulating materials. The wafer W is electrostatically attracted to the electrostatic chuck 222 by a DC voltage applied to the electrode 224 from a DC power source (not shown).

In the mounting table 200, a gas passage 240 for supplying a heat transfer medium (for example, backside gas such as He gas or the like) into the backside of the wafer W is formed to enhance heat transfer efficiency between the substrate mounting surface, an upper surface of the electrostatic chuck 222, and the wafer W. Thus, heat transfer between the susceptor 220 and the wafer W is performed through the heat transfer medium to maintain the wafer W at a predetermined temperature.

In an upper peripheral edge portion of the susceptor 220, the focus ring FR is disposed around the substrate mounting part to surround the wafer W. For example, as illustrated in FIG. 1, the focus ring FR is disposed above an annular dielectric ring 230 arranged on the susceptor 220 to surround the substrate mounting table. A heat transfer sheet HS according to the present embodiment is interposed between the focus ring FR and the dielectric ring 230, thereby enhancing the adhesion between the focus ring FR and the susceptor 220 (in this case, the dielectric ring 230) and improving thermal conductivity therebetween.

Although the heat transfer sheet HS and the focus ring FR are disposed on the susceptor 220 through the dielectric ring 230 in the present embodiment, a conductive ring may be provided instead of the dielectric ring 230. Alternatively, without providing the dielectric ring 230 or the conductive ring, the heat transfer sheet HS and the focus ring FR may be directly disposed on the susceptor 220. A method of installing the heat transfer sheet HS will be described later.

In addition, an upper electrode 120 is provided, above the susceptor 220, opposite to the susceptor 220 in parallel. The upper electrode 120 is held in an inner portion of the processing chamber 102 through an insulating member 122. The upper electrode 120 is configured to include an electrode plate 124 having a plurality of injection holes 123 formed in a surface thereof opposite to the susceptor 220, and an electrode holder 125 for holding the electrode plate 124.

A power supply unit 140 for supplying dual frequency power is connected to the susceptor 220. The power supply unit 140 includes a first high-frequency power supply 142 for supplying first high-frequency power (high-frequency power for plasma generation) of a first frequency, and a second high-frequency power supply 144 for supplying a second high-frequency power (high-frequency power for bias voltage generation) of a second frequency lower than the first frequency. The first and the second high-frequency power 142 and 144 are electrically connected to the susceptor 220 via a first matching circuit 143 and a second matching circuit 145, respectively.

The first and the second matching circuit 143 and 145 function to match load impedance to internal (or output) impedances of the first and the second high-frequency power supply 142 and 144, respectively, and enable the internal impedance and the load impedance of the first and the second high-frequency power supply 142, 144 to be seemingly consistent with each other when the plasma is generated in the processing chamber 102.

A gas inlet 126 is provided in a center of the electrode holder 125 of the upper electrode 120. A gas supply pipe 127 is connected to the gas inlet 126. Also, a processing gas supply source 130 is connected to the gas supply pipe 127 via a valve 128 and a mass flow controller 129.

For example, a plasma etching gas is supplied from the processing gas supply source 130. Although FIG. 1 shows only one processing gas supply system including the gas supply pipe 127, the valve 128, the mass flow controller 129, the processing gas supply source 130 and like, the plasma processing apparatus 100 may have a plurality of processing gas supply systems. For example, etching gases such as $CF_4$, $O_2$, $N_2$, $CHF_3$ and the like may be supplied into the processing chamber 102 with their flow rates controlled independently.

An exhaust pipe 134 is connected to the bottom portion of the processing chamber 102, and an exhaust unit 135 is connected to the exhaust pipe 134. The exhaust part 135 has a vacuum pump such as a turbo molecular pump or the like to adjust the interior of the processing chamber 102 to a depressurized atmosphere. Furthermore, a transfer port 131, through which the wafer W is loaded and unloaded, is provided at a sidewall of the processing chamber 102, and a gate valve G is provided to the transfer port 131 to open and close the transfer port 131.

In the plasma processing apparatus 100, for example, when plasma etching is performed on the wafer W, the wafer W is loaded in the processing chamber 102 to be mounted on the mounting table 200 by a transfer arm (not shown), and the wafer W is electrostatically attracted by the electrostatic chuck 222.

Furthermore, a predetermined processing gas is introduced from the processing gas supply source 130 into the processing chamber 102, and the interior of the processing chamber 102 is exhausted by the exhaust unit 135 to depressurize the interior of the processing chamber 102 to a predetermined vacuum pressure.

In the state where the interior of the processing chamber 102 is maintained at the predetermined vacuum pressure, high-frequency power for plasma generation is applied from the first high-frequency power supply 142 to the susceptor 220, and a high-frequency power for biasing is applied from the second high-frequency power supply 144 to the susceptor 220, so that plasma of the processing gas is generated above the wafer W to thereby perform an etching process.

Next, a method of installing the heat transfer sheet in the plasma processing apparatus 100 will be described. First, the heat transfer sheet HS is adhered to a lower surface of the focus ring FR. In the state where the heat transfer sheet is adhered to the focus ring FR, the focus ring FR is disposed on the mounting table 200 (the dielectric ring 230 in the example shown in FIG. 1).

Meanwhile, since the heat transfer sheet HS is made of, e.g., silicone rubber or the like, when it is adhered to the focus ring FR made of a metal such as aluminum or the like, air bubbles are easily generated therebetween. When air bubbles are generated, the air bubbles serve as an insulating layer. As a result, heat transfer efficiency of the mounting table 200 (susceptor 220) is reduced, and temperature control efficiency of the mounting table 200 (susceptor 220) is deteriorated. Accordingly, the focus ring FR is partially affected by the heat of plasma and the like, and reaches a high temperature, which decreases the in-plane uniformity of a plasma processing characteristic such as an etching characteristic.

In this regard, there has been proposed a technology for removing the air bubbles by controlling the pressure after the heat transfer sheet HS is adhered to the focus ring FR. However, the amount of the air bubbles and the locations where the air bubbles are generated depend on an installation state of the heat transfer sheet. So, the air bubbles cannot be completely removed by the pressure control as in JP2008-171899A because conditions of the air bubbles are changed depending on the initial installation state of the heat transfer sheet.

Thus, in the present embodiment, when the heat transfer sheet HS is adhered to the focus ring FR, the focus ring FR is mechanically pressed against the heat transfer sheet HS. At this time, the focus ring FR is gradually pressed from an inner peripheral side and an outer peripheral side thereof or from the outer peripheral side to the inner peripheral side thereof, so that the air bubbles can be extruded and removed. As a result, when the heat transfer sheet is adhered to the focus ring, the air bubbles therebetween can be always reliably removed.

(Heat Transfer Sheet Adhering Apparatus)

Figure 2:
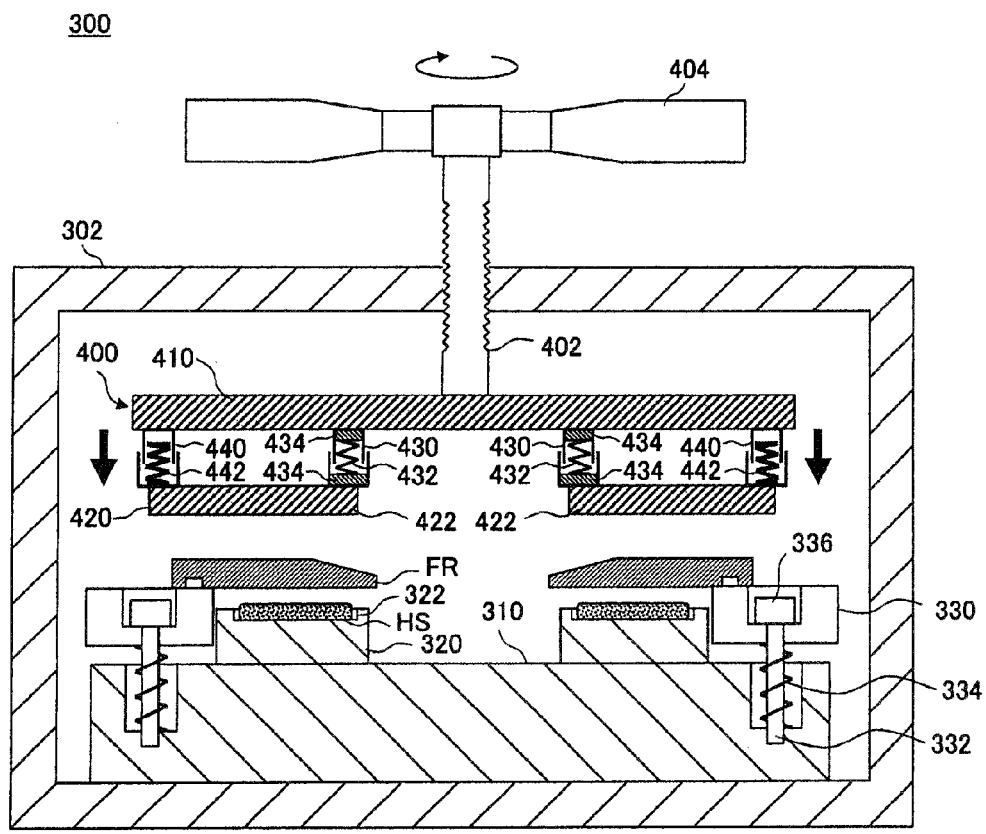
FIG. 2 is a cross-sectional view showing an example of the configuration of a heat transfer sheet adhering apparatus according to the embodiment of the present invention.

An example of the detailed configuration of a heat transfer sheet adhering apparatus capable of performing the method of adhering the heat transfer sheet to the focus ring will be described below with reference to the drawings. FIG. 2 is a cross-sectional view schematically showing the configuration of the heat transfer sheet adhering apparatus according to the present embodiment.

The heat transfer sheet adhering apparatus shown in FIG. 2 includes a housing 302 having a cylindrical sidewall. In the housing 302, a disk-shaped base 310 is provided on a bottom portion of the housing 302, and a ring-shaped heat transfer sheet mounting part 320 for mounting the heat transfer sheet HS thereon is provided on the base 310. A recess portion 322 is formed on an upper surface of the heat transfer sheet mounting part 320, and the heat transfer sheet is mounted on the recess portion 322. Here, a case in which a bottom surface of the recess portion 322 is configured in a flat shape is shown as an example.

A focus ring supporting part 330 as a ring-shaped member supporting part for mounting the focus ring FR thereon is provided in an outer peripheral side of the heat transfer sheet mounting part 320. The focus ring supporting part 330 is vertically movable and is biased upwards. With such configuration, the focus ring FR mounted on the focus ring supporting part 330 can be gradually pressed against the heat transfer sheet HS.

Specifically, the focus ring supporting part 330 is fitted onto a plurality of guide bars 332 erected on the base 310, and is vertically movable along the guide bars 332.

Furthermore, a plurality of biasing members 334 (for example, coil springs) is interposed between the focus ring supporting part 330 and the base 310. The biasing members 334 bias the focus ring support part 330 upwards. Further, stop members 336 are respectively provided at upper ends of the guide bars 332 to restrict the upward movement of the focus ring supporting part 330 so as not to be separated from the base 310 more than a predetermined distance. The height of the restriction position is set such that when the focus ring FR is mounted on the focus ring supporting part 330, a lower surface of the focus ring FR is located higher than an upper surface of the heat transfer sheet mounted on the heat transfer sheet mounting part 320. Thus, the focus ring FR is prevented from contacting the heat transfer sheet HS before the focus ring FR is pressed from above.

A focus ring pressing part (hereinafter referred to as "pressing part") 400 is provided above the heat transfer sheet mounting part 320 to be vertically movable. Specifically, the pressing part 400 is attached to a lower end of a driving bar 402 provided to extend through a ceiling of the housing 302. For example, a thread is formed on the driving bar 402, and the pressing part 400 is moved vertically by rotating the driving bar 402. The driving bar 402 may be rotated by manually turning a handle, or may be automatically rotated by attaching a motor thereto. As an example, FIG. 2 shows the configuration wherein a handle 404 is attached to an upper end of the driving bar 402, and the pressing part 400 is manually moved up and down depending on the rotation of the handle 404.

Figure 3A:
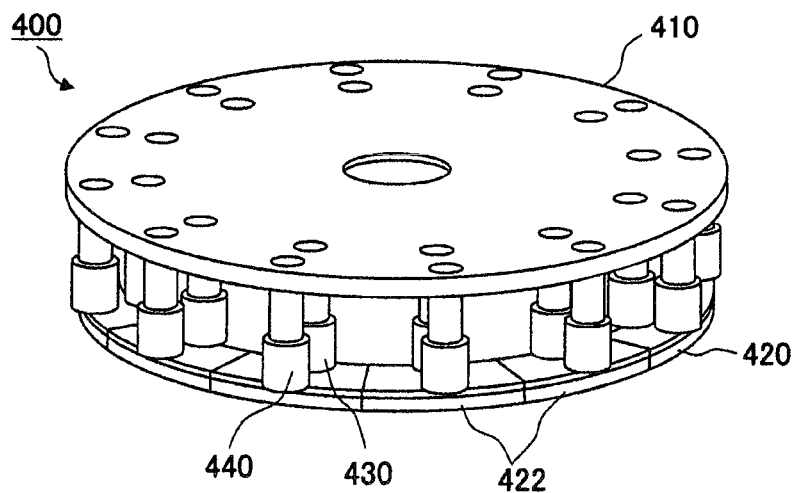
FIG. 3A is a perspective view showing an example of the configuration of a pressing part shown in FIG. 2.
Figure 3B:
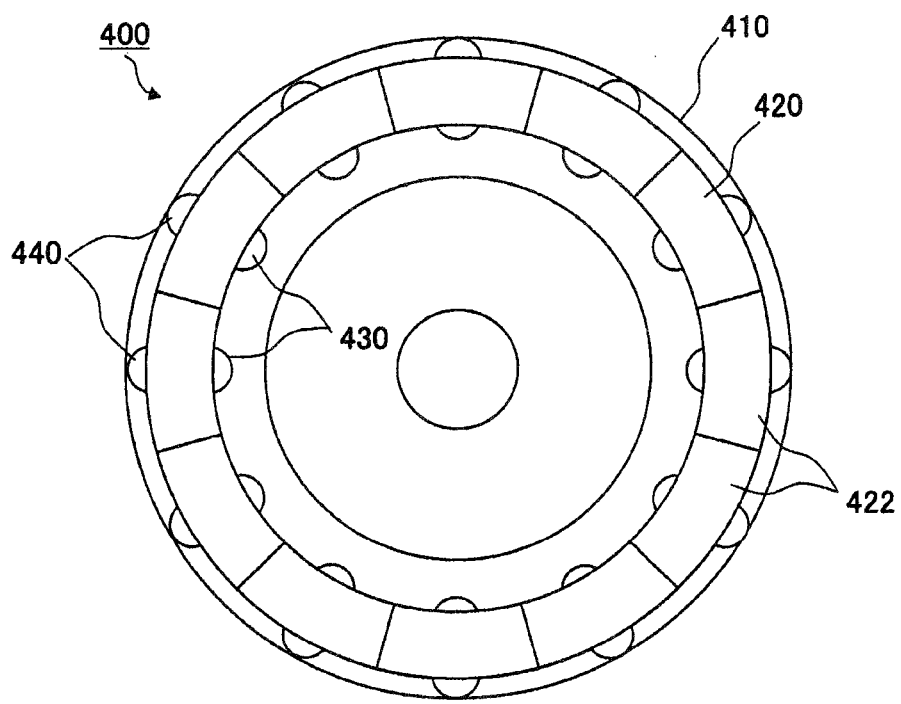
FIG. 3B is a bottom view of the pressing part shown in FIG. 3A as viewed from below.

Here, the pressing part 400 shown in FIG. 2 will be more specifically described with reference to FIGS. 3A and 3B. FIG. 3A is a perspective view showing an example of a configuration of the pressing part 400 shown in FIG. 2, and FIG. 3B is a bottom view of the pressing part 400 shown in FIG. 3A as viewed from below. Here, a case in which the pressing part 400 is configured so as to gradually press the focus ring FR from the inner peripheral side of the focus ring FR to the outer peripheral side is shown as an example.

As illustrated in FIGS. 3A and 3B, the pressing part 400 has a disk-shaped upper plate 410 and a lower plate 420 arranged opposite to the upper plate 410. The lower plate 420 is split into a plurality of plates along a circumferential direction, and each split plate 422 is configured to be independently inclined inwardly or outwardly. As an example, FIG. 3A and FIG. 3B show a case in which the lower plate 420 includes twelve split plates 422. The upper plate 410 and the split plates 422 of the lower plate 420 may be made of metal such as SUS (Stainless Used Steel). Also, when the split plates 422 are formed of a metal, a lower surface thereof may be made of resin so that a surface of the focus ring FR is not easily scratched when the lower surface is in contact with the focus ring FR. Also, the number of the split plates 422 is not limited to 12 but may be more or less than 12.

Each split plate 422 of the lower plate 420 is held by a cylindrical inner peripheral-side biasing body 430 and a cylindrical outer peripheral-side biasing body 440 to the upper plate 410. That is, each split plate 422 is independently held by a pair of the inner peripheral-side biasing body 430 and the outer peripheral-side biasing body 440. Furthermore, as illustrated in FIG. 2, in each split plate 422, biasing elements 432 and 442 (for example, coil springs) for biasing the corresponding split plate 422 downwardly are provided in the inner peripheral-side biasing body 430 and the outer peripheral-side biasing body 440, respectively. Thus, when the focus ring is pressed by the pressing part 400 from above, the focus ring FR may be pressed by bringing each split plate 422 into contact with the focus ring FR.

At this time, in order for each split plate 442 to gradually press the focus ring FR from the inner peripheral side of the focus ring FR to the outer peripheral side, in the present embodiment, as illustrated in FIG. 2, the inner peripheral-side biasing body 430 has a biasing force smaller than that of the outer peripheral-side biasing body 440. Specifically, the biasing element 432 of the inner peripheral-side biasing body 430 has an elastic force smaller than that of the biasing element 442 of the outer peripheral-side biasing body 440. For example, the biasing force of the biasing element 432 of the inner peripheral-side biasing body 430 is ½ of the biasing force of the biasing element 442 of the outer peripheral-side biasing body 440. In a case where the biasing elements 432, 442 are coil springs, when a spring rate of the biasing element 442 of the outer peripheral-side biasing body 440 is $2k$, a spring rate of the biasing element 432 of the inner peripheral-side biasing body 430 becomes $1k$. Accordingly, when the focus ring FR is pressed by the pressing part 400, the focus ring FR is pressed stronger by the outer peripheral-side biasing body 440 than by the inner peripheral-side biasing body 430.

Furthermore, as illustrated in FIG. 2, only the inner peripheral-side biasing body 430 has washers 434 provided at an upper side and a lower side of the biasing element 432. Thus, when the focus ring FR is pressed by the pressing part 440, the inner peripheral-side biasing body 430 can press the focus ring FR prior to the outer peripheral-side biasing body 440 due to the thickness of the two washers 434.

Figure 4:
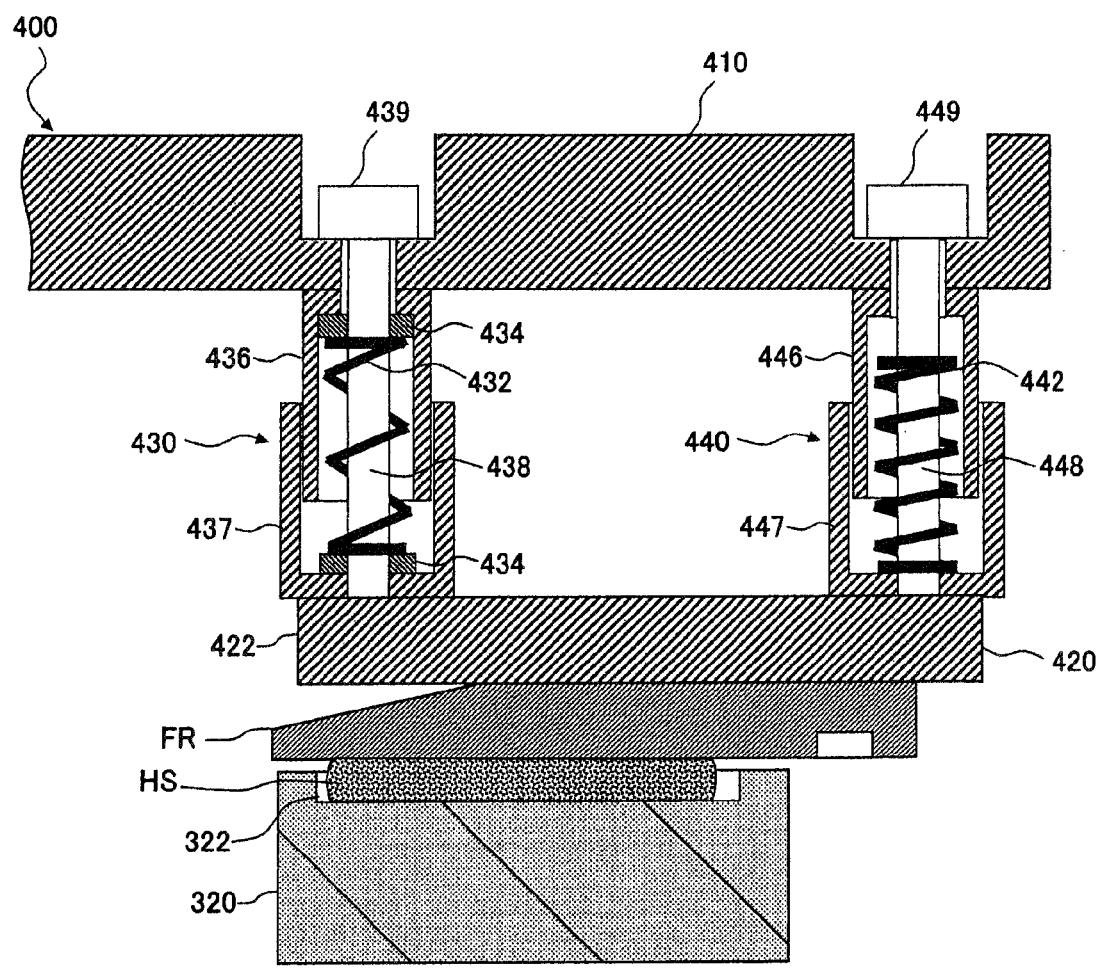
FIG. 4 is a partial cross-sectional view of the pressing part according to the embodiment of the present invention.

An example of the detailed configuration of the inner peripheral-side biasing body 430 and the outer peripheral-side biasing body 440 will be more specifically described with reference to FIG. 4. FIG. 4 is a partial cross-sectional view of the pressing part 400. As illustrated in FIG. 4, the inner peripheral-side biasing body 430 and the outer peripheral-side biasing body 440 are configured such that upper cylindrical members 436, 446, which are adhered to the upper plate 410 to be opened downward, are inserted into respective lower cylindrical members 437, 447, which are adhered to each split plate 422 of the lower plate 420 to be opened upwards.

Guide rods 438, 448 provided between the upper plate 410 and the lower plate 420 are inserted into the upper cylindrical members 436, 446 and the lower cylindrical members 437, 447. A lower end of each guide rod 438 or 448 is attached to a bottom wall of the lower cylindrical member 437 or 447 and an upper end of each guide rod 438 or 448 extends through an upper wall of the upper cylindrical member 436 or 446 and a thinner portion of the upper plate 410. The biasing member 432 of the inner peripheral-side biasing body 430 is provided between the lower surface of the upper wall of the upper cylindrical member 436 and the upper surface of the bottom wall of the lower cylindrical member 437 via the respective washers 434. The biasing member 442 of the outer peripheral-side biasing body 440 is provided between the lower surface of the upper wall of the upper cylindrical member 446 and the upper surface of the bottom wall of the lower cylindrical member 447 without any washer.

Stoppers 439 or 449 are provided at the respective upper ends of the guide bars 438 or 448 to restrict a distance between the upper plate 410 and the lower plate 420.

(Operation of Pressing Part)

Next, the operation of the pressing part 400 having the configuration as described above when the heat transfer sheet HS is adhered to the focus ring FR by the pressing part 400 will be explained with reference to FIG. 5A to FIG. 5D. FIG. 5A to FIG. 5D show the pressing forces of the inner peripheral-side biasing body 430 and the outer peripheral-side biasing body 440 as white arrows for each understanding of the operation of the pressing part 400.

First, when each split plate 422 of the lower plate 420 comes into contact with an upper surface of the focus ring FR by moving the pressing part 400 shown in FIG. 4 downwardly, the biasing force of the biasing element 432 of the inner peripheral-side biasing body 430 is first applied to the focus ring FR due to the thickness of the washers 434, and then the biasing force of the biasing element 442 of the outer peripheral-side biasing body 440 is applied to the focus ring FR by further moving the pressing part 400 downwardly.

Figure 5A:
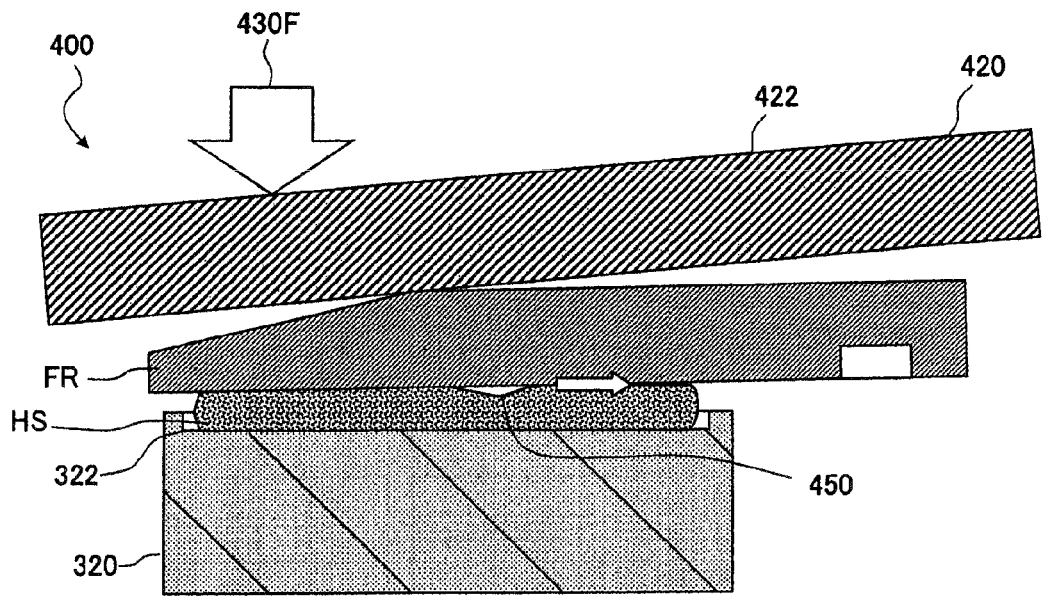
FIGS. 5A to 5D are views for explaining an operation of the pressing part according to the embodiment of the present invention.
Figure 5B:
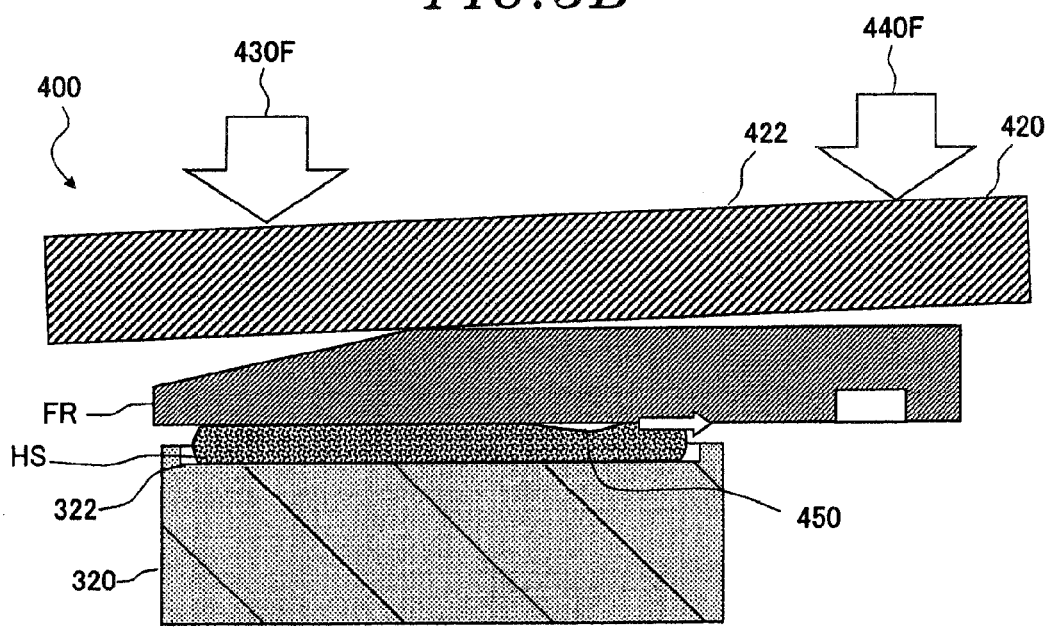
Figure 5C:
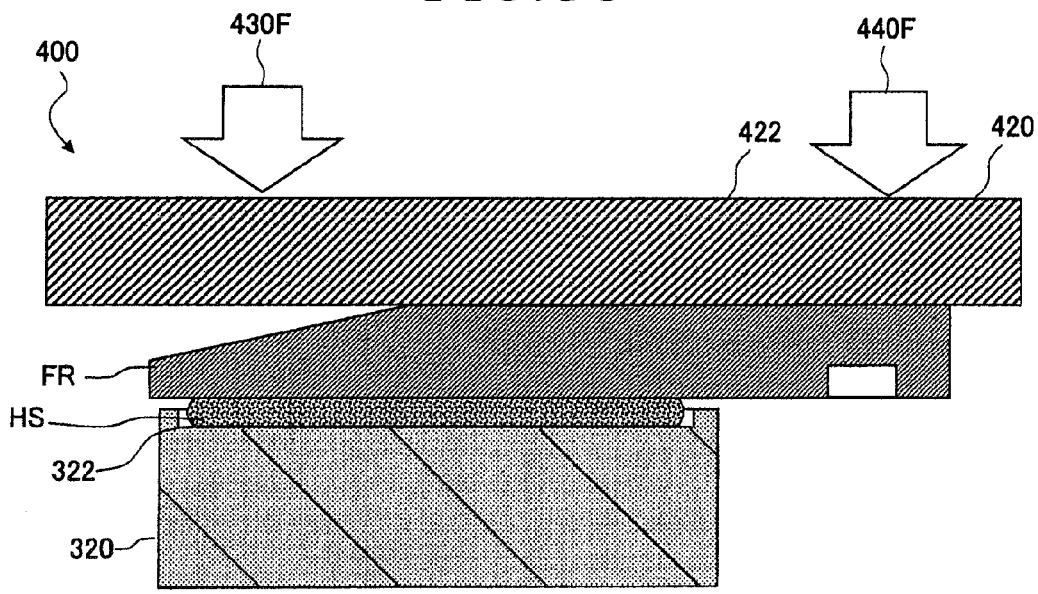
Figure 5D:
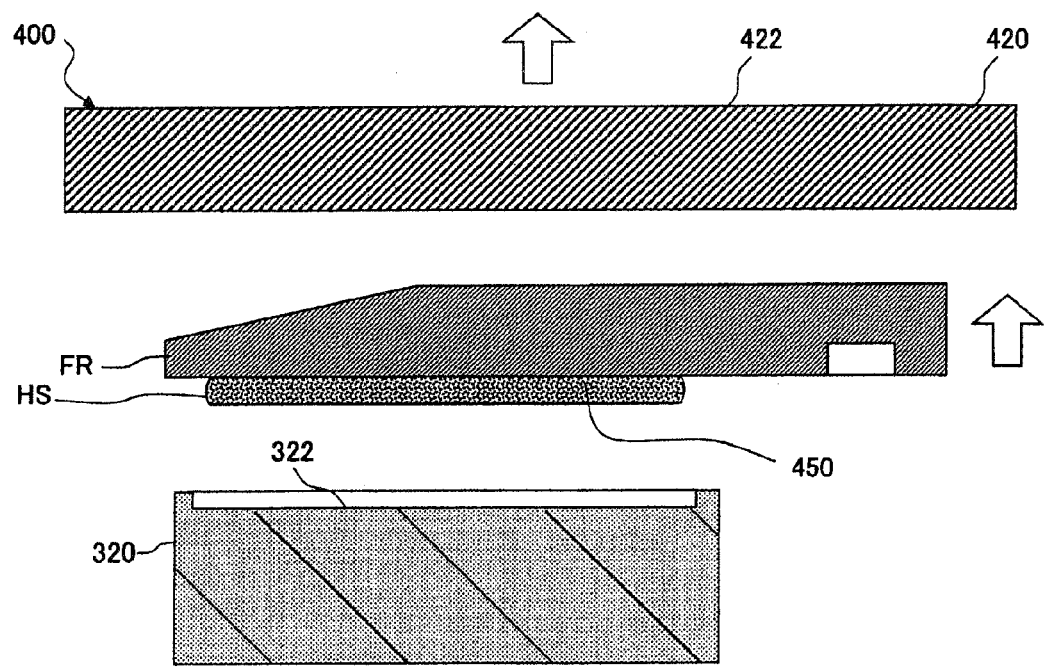

Accordingly, as shown in FIG. 5A through FIG. 5C, the pressing force 430F of the inner peripheral-side biasing body 430 is first applied to the focus ring FR, and thereafter the pressing force 430F of the outer peripheral biasing body 440 is applied to the focus ring FR. As a result, the focus ring FR is gradually pressed from the inner peripheral portion thereof to the outer peripheral portion. Thus, as illustrated in FIG. 5A, even though air bubbles 450 are generated between the focus ring FR and the heat transfer sheet HS, the air bubbles 450 gradually move to the outer peripheral side of the focus ring FR as illustrated in FIG. 5B, and are removed as illustrated in FIG. 5C. In this way, the heat transfer sheet HS may be adhered to the lower surface of the focus ring FR in a state where no air bubbles exist. When the adhering of the heat transfer sheet HS is completed, the pressing part 400 is moved upwardly as illustrated in FIG. 5D. Then, the focus ring supporting part 330 shown in FIG. 2 is moved upwardly by the biasing force of the biasing members 334, thereby enabling the focus ring FR to be unloaded.

Figure 6A:
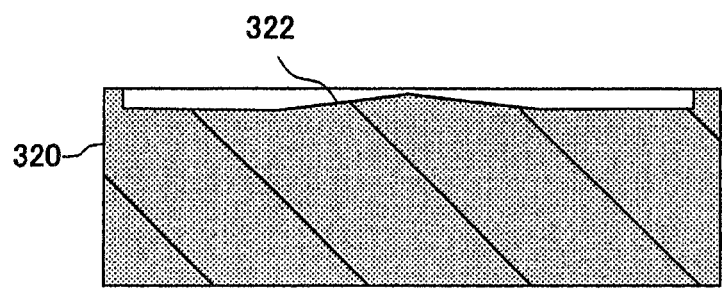
FIG. 6A is a cross-sectional view showing a modification of a heat transfer sheet mounting part according to the embodiment of the present invention.
Figure 6B:
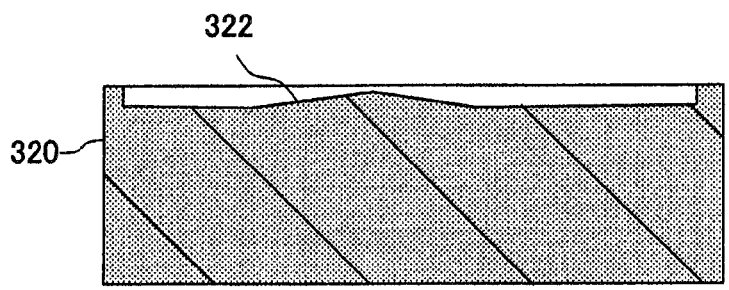
FIG. 6B is a cross-sectional view showing another modification of the heat transfer sheet mounting part according to the embodiment of the present invention.

In the present embodiment, the surface of the heat transfer sheet mounting part 320 on which the heat transfer sheet HS is mounted has a flat shape; however, the present invention is not limited thereto. For example, as illustrated in FIG. 6A and FIG. 6B, the surface of the heat transfer sheet mounting part 320 on which the heat transfer sheet HS is mounted may have a convex taper shape. In this case, as illustrated in FIG. 6A, it is preferable that the highest part of the taper shape is arranged to correspond to the center between an inner peripheral edge and an outer peripheral edge of the heat transfer sheet HS. In this way, by making the surface on which the heat transfer sheet HS is mounted in the taper shape, when the focus ring FR is pressed by the pressing part, the heat transfer sheet HS is pressed against the surface of the taper shape from the inner peripheral side to the outer peripheral side, so that a pressing force applied to the portion of the heat transfer sheet HS corresponding to the taper shape increases, thereby enabling the air bubbles to more easily move to the outer peripheral side.

Further, a position of the highest portion of the surface with the taper shape is not limited to the case shown in FIG. 6A. For example, as illustrated in FIG. 6B, the highest portion of the surface with the taper shape may be located offset to the inner peripheral edge. As described above, when the surface of the heat transfer sheet mounting part 320 on which the heat transfer sheet HS is mounted has the taper shape, a taper angle thereof may be arbitrarily set.

In the present embodiment, the pressing part 400 is configured such that the focus ring FR is pressed by the inner peripheral-side biasing body 430 prior to the outer peripheral-side biasing body 440 to allow the focus ring FR to be gradually pressed from the inner peripheral side thereof to the outer peripheral side. Further, the pressing force of the inner peripheral-side biasing body 430 is smaller than that of the outer peripheral-side biasing body 440. However, the present invention is not limited to the above. The pressing part 400 may be configured so that the focus ring FR is gradually pressed from the outer peripheral side thereof to the inner peripheral side. In this case, for example, the configurations of the outer peripheral-side biasing body 440 and the inner peripheral-side biasing body 430 may be exchanged. Specifically, the focus ring FR may be pressed by the outer peripheral-side biasing body 440 prior to the inner peripheral-side biasing body 430. The pressing force of the outer peripheral-side biasing body 440 may be smaller than that of the inner peripheral-side biasing body 430.

In accordance with the heat transfer sheet adhering apparatus 300 of the present embodiment as explained above, it is possible to remove the air bubbles between the focus ring FR and the heat transfer sheet HS at the same time when adhering the heat transfer sheet HS to the focusing ring FR.

(Entire Operation of Heat Transfer Sheet Adhering Apparatus)

Figure 7A:
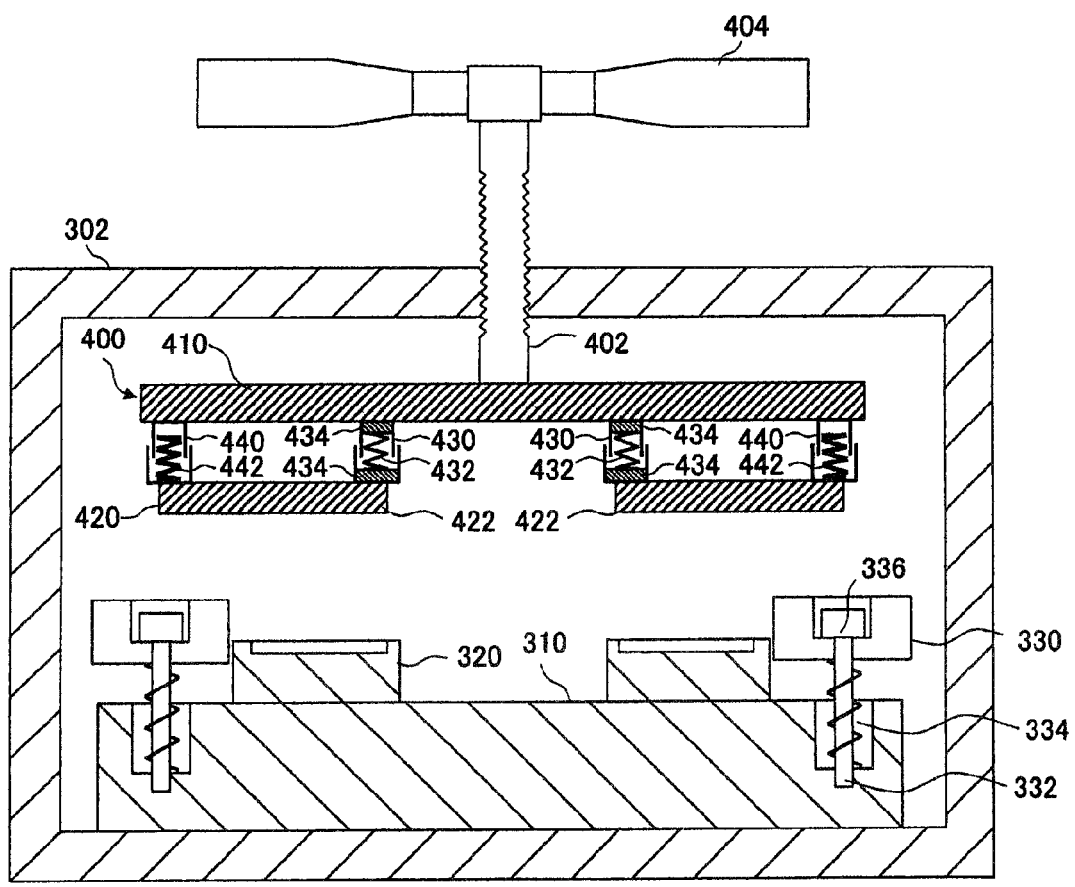
FIGS. 7A to 7F are views for explaining an operation of the heat transfer sheet adhering apparatus according to the embodiment of the present invention.

The entire operation of the heat transfer sheet adhering apparatus 300 will now be described with reference to FIG. 7A to FIG. 7F. FIG. 7A shows an initial state in which the pressing part 400 is disposed at an upper position, but the transfer heat sheet HS and the focus ring FR is not yet disposed.

Figure 7B:
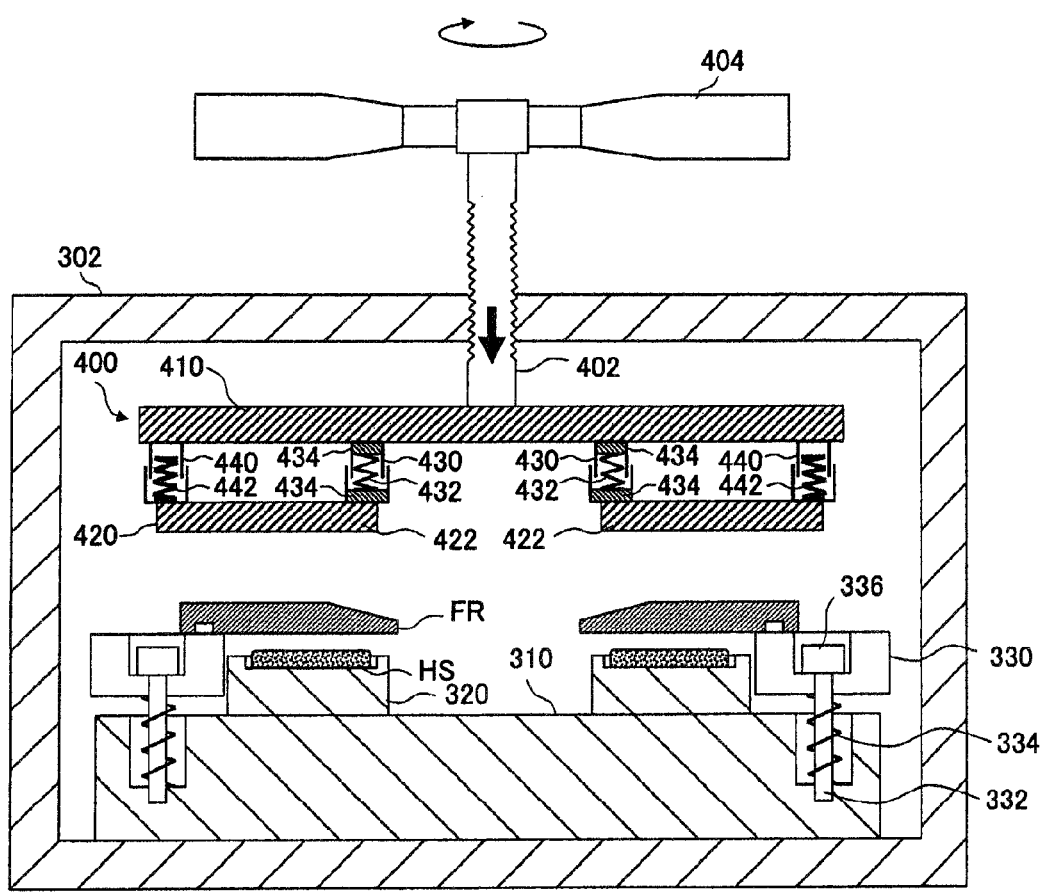

First, the heat transfer sheet HS is mounted on the heat transfer sheet mounting part 320 shown in FIG. 7A, and then the focus ring FR is mounted on the focus ring supporting part 330 (FIG. 7B). A part of the sidewall of the housing 302 may be configured to be opened and closed so that the heat transfer sheet HS and the focus ring FR can be set up in the heat transfer sheet adhering apparatus 330. Alternatively, a ceiling of the housing 302 may be configured to be opened and closed.

Figure 7C:
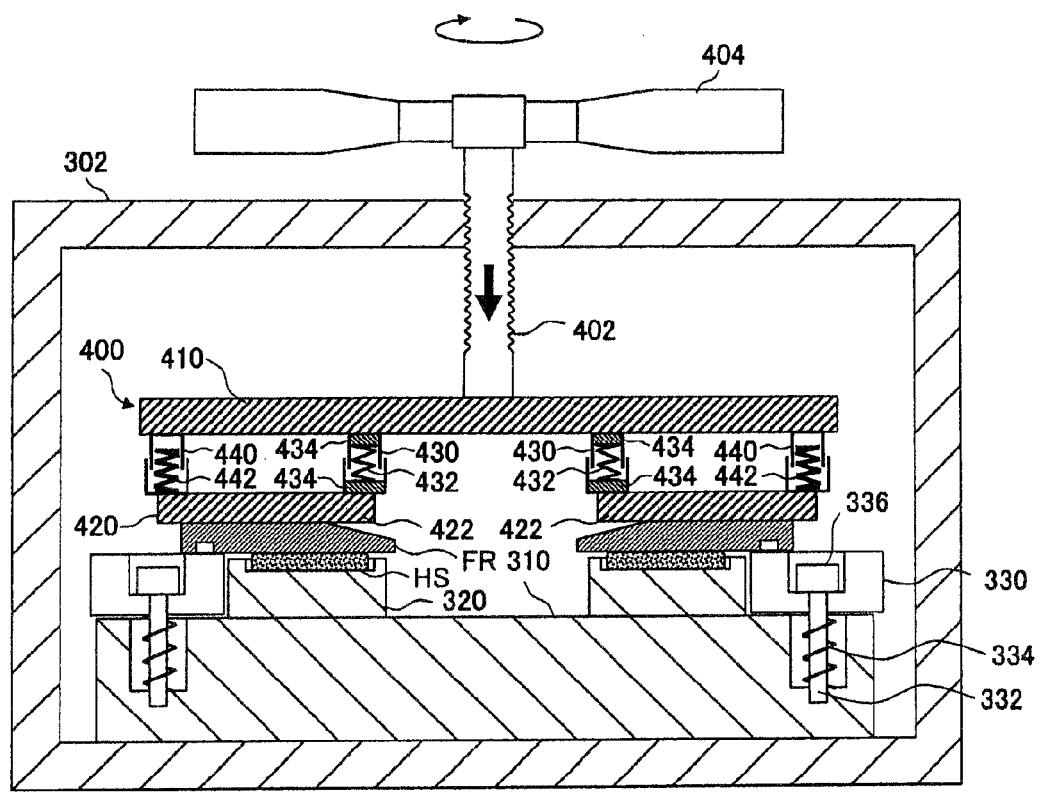

As illustrated in FIG. 7B, in the state where the heat transfer sheet HS and the focus ring FR are set up, the pressing part 400 is moved downwardly by turning the handle 404. Thus, as shown in FIG. 7C, the lower plate 420 of the pressing part 400 comes into contact with the upper surface of the focus ring FR. The focus ring FR can be pressed against the heat transfer sheet HS by the lower plate 420 of the pressing part 400 by further turning the handle 404.

Figure 7D:
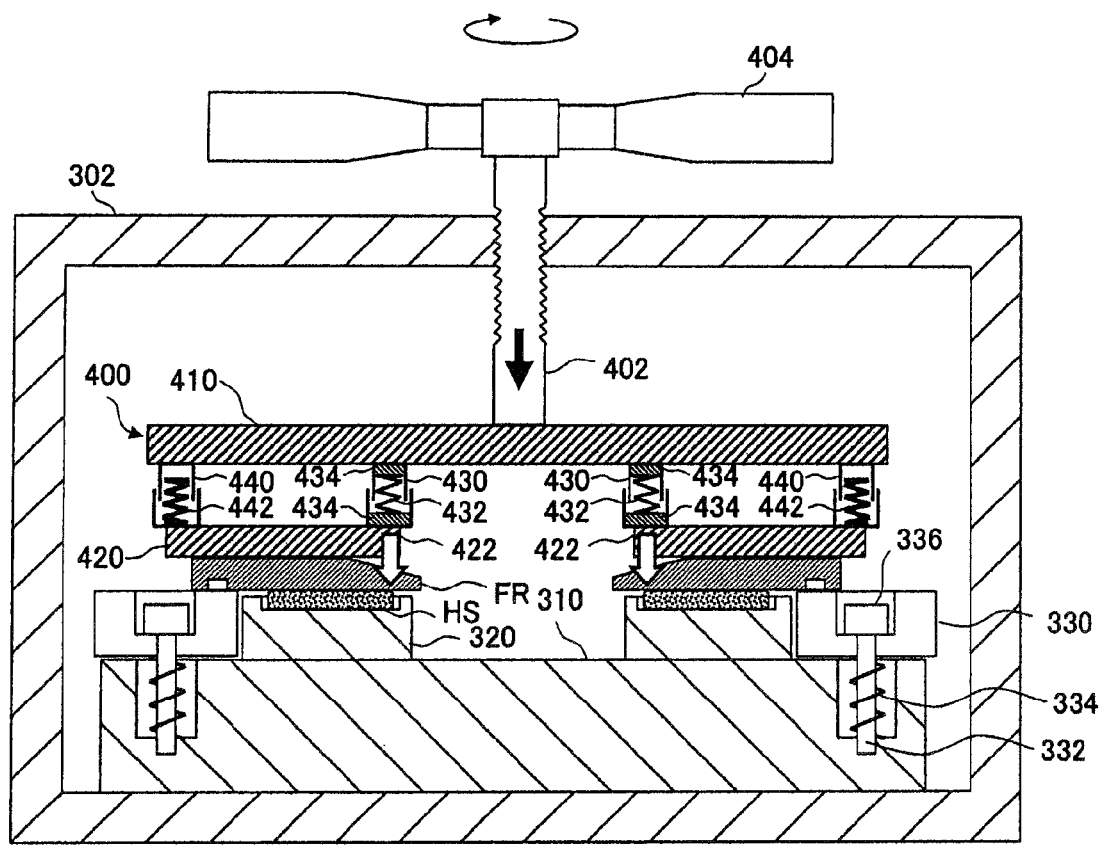
Figure 7E:
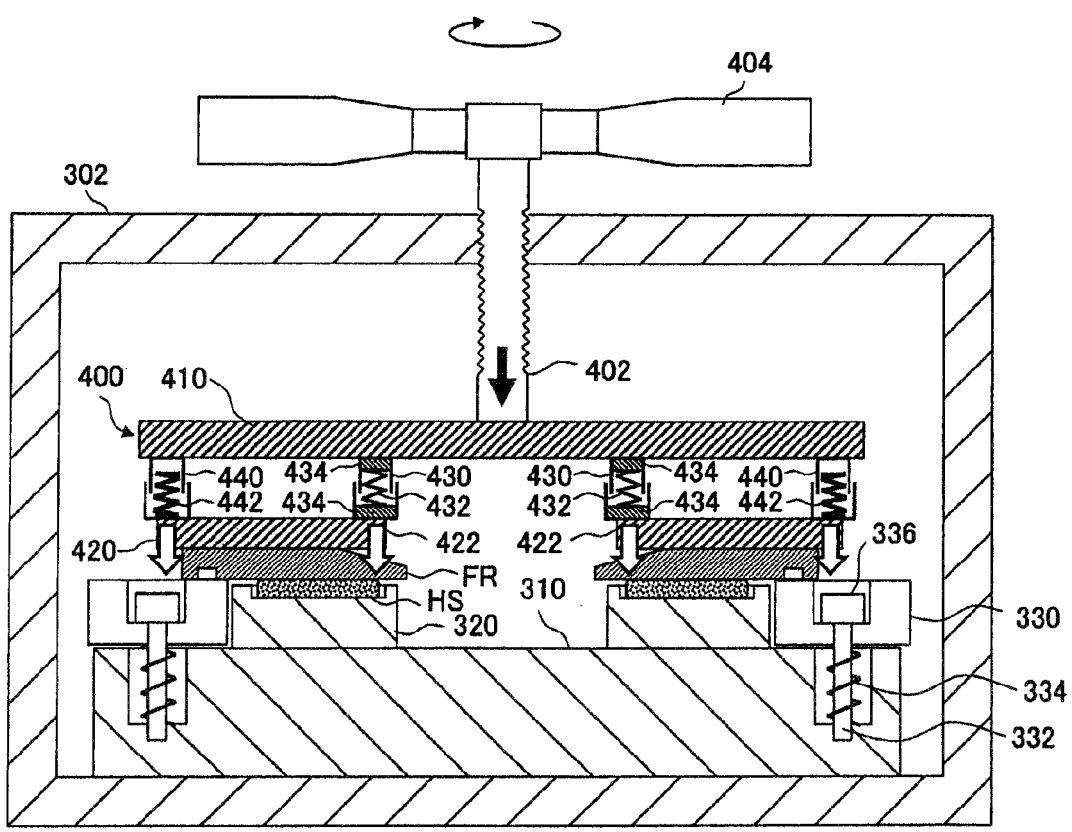

At this time, as illustrated in FIG. 7D, in the beginning, the biasing element 432 of the inner peripheral-side biasing body 430 starts to apply the pressing force to the focus ring FR, and then, as illustrated in FIG. 7E, the biasing element 442 of the outer peripheral biasing body 440 starts to apply the pressing force to the focus ring FR. The focus ring FR is gradually pressed from the inner peripheral side thereof to the outer peripheral side by still further turning the handle 404. Accordingly, as illustrated in FIG. 5A through 5C, the air bubbles between the focus ring FR and the heat transfer sheet HS are gradually moved toward the outer peripheral side and are then discharged from the outer peripheral edge portion. In this way, adhering the heat transfer sheet HS to the focus ring FR and removing the air bubbles therebetween are completed.

Figure 7F:
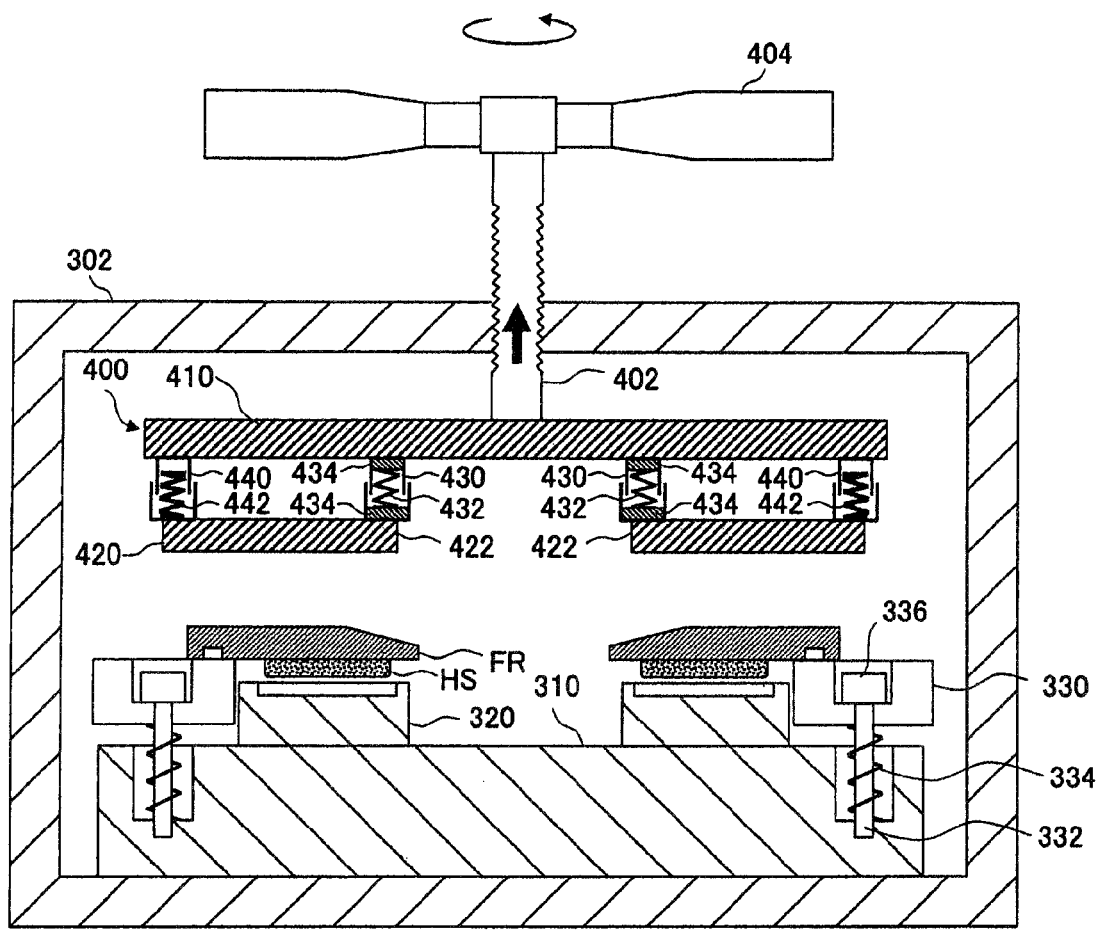

After this, by turning the handle 404 in reverse, the pressing part 400 is moved upwardly as illustrated in FIG. 7F, and the focus ring supporting member 330 is moved upwardly by the biasing force of the biasing member 334. Then, the focus ring FR is lifted up in a state where the heat transfer sheet HS is adhered thereto, thereby enabling the focus ring FR to be unloaded.

The focus ring FR unloaded from the heat transfer sheet adhering apparatus 300 is mounted on the mounting table 200 of the plasma processing apparatus 100 shown in FIG. 1 in the state where the heat transfer sheet HS is adhered to the focus ring FR, and is adhered to the dielectric ring 230. The heat transfer sheet HS is mounted on the heat transfer sheet mounting part 320 in the state where a detachable anti-adhesion film is adhered to an adhesive surface of a lower side of the heat transfer sheet HS. The focus ring FR is mounted on the mounting table 200 after peeling off the anti-adhesion film of the adhesive surface of the lower side of the heat transfer sheet HS.

In this way, since no air bubbles exit between the heat transfer sheet HS and the focus ring FR, thermal conductivity can be improved and the in-plane uniformity of the plasma processing characteristic such as an etching characteristic can be improved. Further, since the focus ring FR may be pressed against the heat transfer sheet HS from the inner peripheral side thereof to the outer peripheral side by the pressing part 400, the air bubbles can be reliably removed. Furthermore, since the air bubbles are removed by the mechanical method using the pressing part 400, when the heat transfer sheet HS is adhered to the focus ring FR, the air bubbles therebetween can be reliably removed.

In the aforementioned embodiment, the focus ring supporting part 330 is provided at an outer peripheral side of the heat transfer sheet mounting part 320. However, the present invention is not limited to the above. The focus ring supporting part 330 may be provided at an inner peripheral side of the heat transfer sheet mounting part 320. Furthermore, for example, as shown in FIG. 8, the focus ring supporting part 330 may be provided at both the inner peripheral side and the outer peripheral side of the mounting surface 321 of the heat transfer sheet mounting part 320, and the focus ring supporting parts 330 may be connected to connection members 338 to be moved up and down together.

Figure 8:
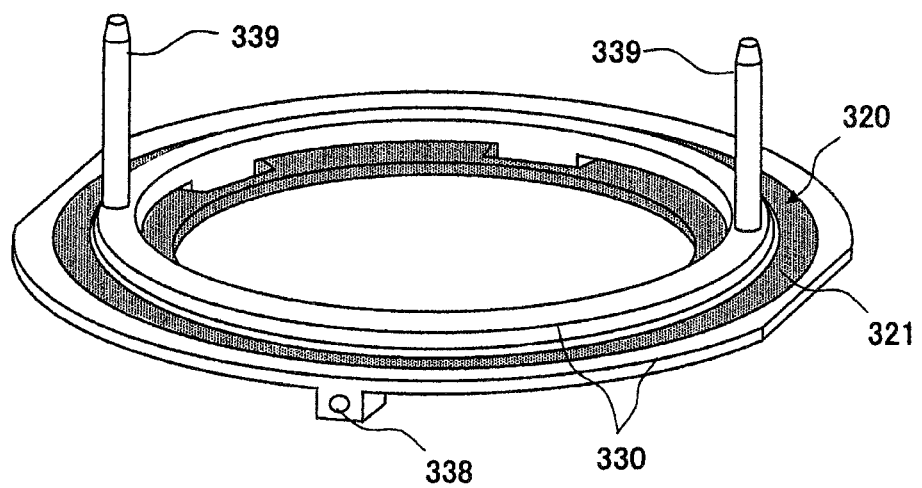
FIG. 8 is a perspective view showing a modification of the heat transfer sheet mounting part according to the embodiment of the present invention.

In this case, as illustrated in FIG. 8, bar-shaped members 339 are provided at the inner focus ring supporting part 330, and biasing members (not shown) for biasing the focus ring supporting parts 330 upwards may be provided in the respective bar-shaped members 339.

Figure 9:
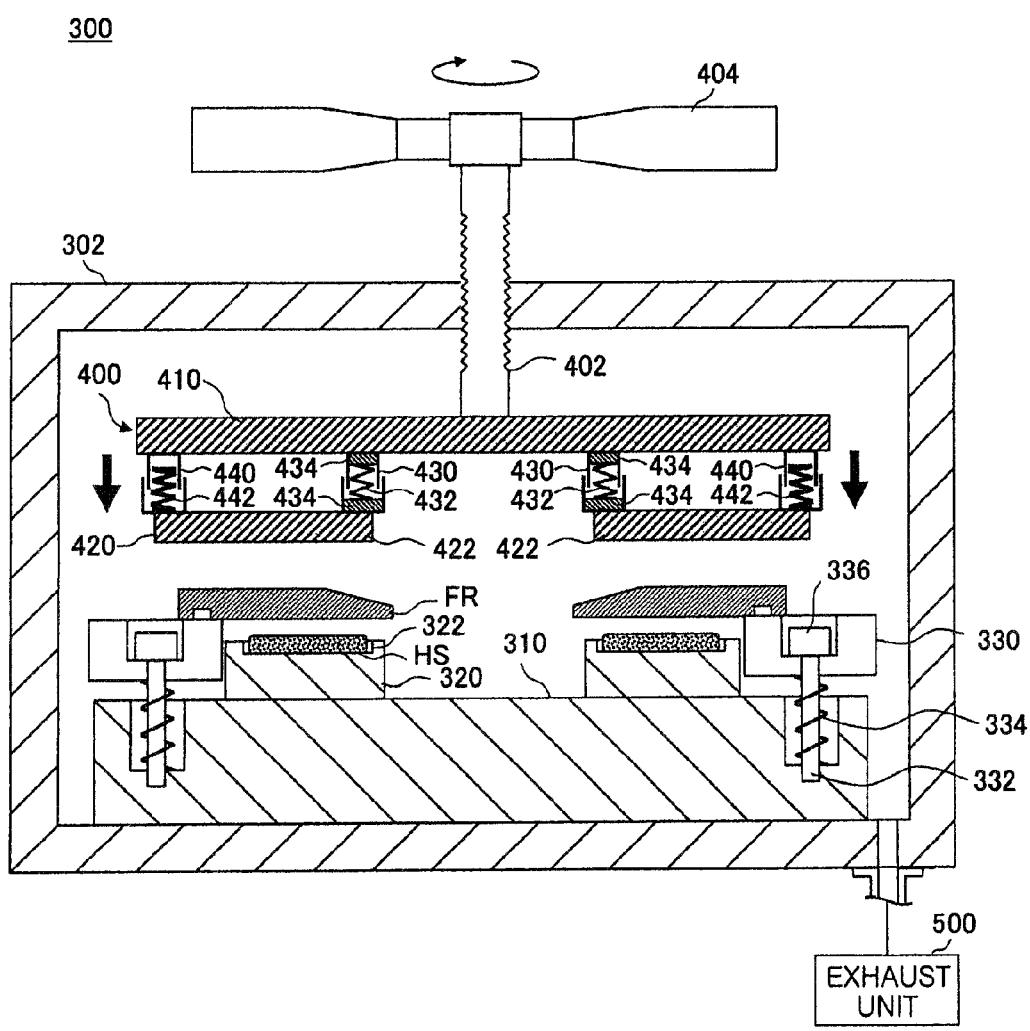
FIG. 9 is a cross-sectional view showing a modification of the heat transfer sheet adhering apparatus according to the embodiment of the present invention.

Also, as shown in FIG. 9, the heat transfer sheet adhering apparatus 330 may be connected to an exhaust unit 500 such as a vacuum pump or the like so that the inside of the housing 302 is depressurized to a vacuum pressure. With such configuration, in a state where the inside of the heat transfer sheet adhering apparatus 300 is maintained in a vacuum atmosphere, adhering the heat transfer sheet HS and removing the air bubbles may be performed.

Accordingly, the removal efficiency of the air bubbles can be improved.

While the present invention has been shown and described with respect to the embodiments, it will be understood by those skilled in the art that various changes and modifications may be made without departing from the scope of the invention as defined in the following claims. It will be understood that these changes and modifications fall within the technical scope of the present invention.

For example, as the ring-shaped member used in the substrate processing apparatus, the focus ring for the plasma processing apparatus may be used as an example. The present invention may be applied to any ring-shaped member to which the heat transfer sheet can be adhered.

What is claimed is:

1. A heat transfer sheet adhering apparatus for adhering a heat transfer sheet to a ring-shaped member adapted to be used in a substrate processing apparatus, the heat transfer sheet adhering apparatus comprising:
   a heat transfer sheet mounting part configured to mount the heat transfer sheet thereon;
   a ring-shaped member supporting part configured to support the ring-shaped member; and
   a vertically movable pressing part configured to press the ring-shaped member supported by the ring-shaped member supporting part against the heat transfer sheet mounted on the heat transfer sheet mounting part;
   wherein the pressing part is configured to press the ring-shaped member gradually from an inner peripheral side to an outer peripheral side of the ring-shaped member or from the outer peripheral side to the inner peripheral side of the ring-shaped member.

2. The apparatus of claim 1, wherein the pressing part comprises: an upper plate; a lower plate arranged opposite to the upper plate, the lower plate including a plurality of split plates split in a circumferential direction; inner peripheral-side biasing bodies each of which is interposed between the upper plate and each of the split plates at an inner peripheral portion of the corresponding split plate and configured to hold the corresponding split plate to the upper plate; and outer peripheral-side biasing bodies each of which is interposed between the upper plate and each of the split plates at an outer peripheral portion of the corresponding split plate and configured to hold the corresponding split plate to the upper plate, and
   wherein the inner peripheral-side biasing body and the outer peripheral-side biasing body for each split plate are configured such that the ring-shaped member is pressed by one of them prior to the other.

3. The apparatus of claim 2, wherein one of the inner peripheral-side biasing body and the outer peripheral-side biasing body for each split plate, which presses the ring-shaped member earlier than the other, has a biasing force smaller than that of the other.

4. The apparatus of claim 1, further comprising: an exhaust unit configured to depressurize an inside of a housing, wherein the pressing part is operated to adhere the heat transfer sheet to the ring-shaped member in a state where the inside of the housing is maintained by the exhaust unit in a vacuum pressure atmosphere.

5. The apparatus of claim 2, further comprising: an exhaust unit configured to depressurize an inside of a housing, wherein the pressing part is operated to adhere the heat transfer sheet to the ring-shaped member in a state where the inside of the housing is maintained by the exhaust unit in a vacuum pressure atmosphere.

6. The apparatus of claim 3, further comprising: an exhaust unit configured to depressurize an inside of a housing, wherein the pressing part is operated to adhere the heat transfer sheet to the ring-shaped member in a state where the inside of the housing is maintained by the exhaust unit in a vacuum pressure atmosphere.

7. The apparatus of claim 1, wherein the ring-shaped member supporting part is provided at one or both of an inner peripheral side and an outer peripheral side of the heat transfer sheet mounting part.

8. The apparatus of claim 2, wherein the ring-shaped member supporting part is provided at one or both of an inner peripheral side and an outer peripheral side of the heat transfer sheet mounting part.

9. The apparatus of claim 3, wherein the ring-shaped member supporting part is provided at one or both of an inner peripheral side and an outer peripheral side of the heat transfer sheet mounting part.

10. The apparatus of claim 4, wherein the ring-shaped member supporting part is provided at one or both of an inner peripheral side and an outer peripheral side of the heat transfer sheet mounting part.

11. The apparatus of claim 5, wherein the ring-shaped member supporting part is provided at one or both of an inner peripheral side and an outer peripheral side of the heat transfer sheet mounting part.

12. The apparatus of claim 6, wherein the ring-shaped member supporting part is provided at one or both of an inner peripheral side and an outer peripheral side of the heat transfer sheet mounting part.

* * * * *